United States Patent
Saenger

(10) Patent No.: US 10,041,836 B2
(45) Date of Patent: Aug. 7, 2018

(54) POLARIZATION MEASURING DEVICE, LITHOGRAPHY APPARATUS, MEASURING ARRANGEMENT, AND METHOD FOR POLARIZATION MEASUREMENT

(71) Applicant: Carl Zeiss SMT GmbH, Oberkochen (DE)

(72) Inventor: Ingo Saenger, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 28 days.

(21) Appl. No.: 14/799,503

(22) Filed: Jul. 14, 2015

(65) Prior Publication Data

US 2015/0323387 A1 Nov. 12, 2015

Related U.S. Application Data

(63) Continuation of application No. PCT/EP2014/050445, filed on Jan. 13, 2014.

(60) Provisional application No. 61/752,122, filed on Jan. 14, 2013.

(30) Foreign Application Priority Data

Jan. 14, 2013 (DE) ........................ 10 2013 200 394

(51) Int. Cl.
*G03B 27/72* (2006.01)
*G01J 4/04* (2006.01)
*G03F 7/20* (2006.01)

(52) U.S. Cl.
CPC .............. *G01J 4/04* (2013.01); *G03F 7/7085* (2013.01); *G03F 7/70566* (2013.01)

(58) Field of Classification Search
CPC ........ G01J 4/04; G03F 7/70566; G03F 7/7085
USPC ............................................. 355/71
See application file for complete search history.

(56) References Cited

U.S. PATENT DOCUMENTS

| | | |
|---|---|---|
| 4,132,653 A | 1/1979 | Samson |
| 4,725,145 A | 2/1988 | Azzam |
| 5,502,567 A | 3/1996 | Pokrowsky et al. |
| 2007/0182969 A1 | 8/2007 | Mengel et al. |

(Continued)

FOREIGN PATENT DOCUMENTS

| | | |
|---|---|---|
| DE | 10124803 A1 | 11/2002 |
| DE | 10347978 A1 | 6/2005 |

(Continued)

OTHER PUBLICATIONS

Written Opinion in counterpart International Application No. PCT/EP2014/050445, dated Aug. 4, 2014.

(Continued)

*Primary Examiner* — Peter B Kim
(74) *Attorney, Agent, or Firm* — Edell, Shapiro & Finnan, LLC

(57) ABSTRACT

A polarization measuring device (10) for determining the polarization of a light beam (16, 46) that includes a reflector (12, 58) and a detector (14, 20). The reflector (12, 58) is configured such that the plane of incidence of the light rays in the light beam (16, 46) varies in a location-dependent manner, such that the reflector (12, 58) reflects differing polarization components of the light beam (16, 46) to different extents depending on the plane of incidence. The detector (14, 20) serves to detect the differing polarization components.

30 Claims, 10 Drawing Sheets

(56) References Cited

U.S. PATENT DOCUMENTS

| | | | |
|---|---|---|---|
| 2007/0288121 A1* | 12/2007 | Shibazaki | G03F 7/70516 |
| | | | 700/213 |
| 2010/0208264 A1 | 8/2010 | Brunner et al. | |
| 2011/0032502 A1 | 2/2011 | Nomura | |
| 2011/0242517 A1 | 10/2011 | Mann et al. | |
| 2012/0092669 A1 | 4/2012 | Fiolka et al. | |

FOREIGN PATENT DOCUMENTS

| | | |
|---|---|---|
| DE | 102009021096 A1 | 2/2010 |
| DE | 102011078928 A1 | 1/2013 |
| EP | 1306665 A2 | 5/2003 |
| JP | S61120927 A | 6/1986 |
| JP | H02253127 A | 10/1990 |
| JP | H08201176 A | 8/1996 |
| JP | 2009277928 A | 11/2009 |
| JP | 2012520993 A | 9/2012 |
| WO | 2005078778 A1 | 8/2005 |
| WO | 2010105757 A1 | 9/2010 |

OTHER PUBLICATIONS

Office Action in corresponding Japanese Application 2015552065, dated Dec. 5, 2017, along with English Translation.

\* cited by examiner

POLARIZATION MEASURING DEVICE, LITHOGRAPHY APPARATUS, MEASURING ARRANGEMENT, AND METHOD FOR POLARIZATION MEASUREMENT

CROSS-REFERENCE TO RELATED APPLICATIONS

This application is a Continuation of International Application No. PCT/EP2014/050445, filed on Jan. 13, 2014, which claims benefit under 35 U.S.C. § 119(e) to U.S. Provisional Application No. 61/752,122, filed Jan. 14, 2013, and which claims priority under 35 U.S.C. § 119(a) to German Patent Application No. 10 2013 200 394.3, also filed on Jan. 14, 2013. The disclosures of all three related applications are considered part of and are incorporated by reference into the disclosure of the present application in their respective entireties.

FIELD OF THE INVENTION

The invention relates to polarization measuring devices, and to lithography apparatuses and measuring arrangements comprising such a polarization measuring device, and to methods for polarization measurement.

BACKGROUND

Lithography apparatuses are used for example in the production of integrated circuits or ICs in order to image a mask pattern in a mask onto a substrate, such as e.g. a silicon wafer. In this case, a light beam generated by an illumination device is directed through the mask onto the substrate. An exposure lens consisting of a plurality of optical elements serves for focusing the light beam on the substrate.

The extent of the smallest structure elements which can be realized on the wafer is proportional to the wavelength of the light used for exposure and inversely proportional to the numerical aperture of the optical elements (lens elements or mirrors) used for beam shaping. In order to meet the requirements for ever smaller structures, there was a development toward light sources having ever shorter wavelengths, through to EUV (Extreme UltraViolet) light sources having a wavelength of less than 30 nm, in particular less than 13 nm or even less than 5 nm. Such short wavelengths make it possible to image extremely small structures on the wafer. Since light in this wavelength range is absorbed by atmospheric gases, the beam path of such EUV lithography apparatuses is situated in a high vacuum. Furthermore, there is no material that is sufficiently transparent in the wavelength range mentioned, for which reason mirrors are used as optical elements for shaping and guiding the EUV radiation.

In order to improve the imaging quality of microlithography apparatuses, it has been proposed to deliberately influence the polarization state of the light used for image generation. In this regard, the published patent application DE 101 24 803 A1 proposes a polarizer for generating a light beam having a predefined distribution of polarization states over its cross section, and a microlithography apparatus comprising such a polarizer.

Furthermore, the mirrors used for beam guiding can also influence the polarization since they can have a different reflectivity for p-polarized and s-polarized light, which can lead to image aberrations or other effects to be avoided.

In order to monitor and, if appropriate, optimize the polarization of light in the microlithography apparatus, a polarization measuring technique for measuring the polarization state is necessary. WO 2010/105757 A1, DE 10 2009 021 096 A1, US 2007/182969 A1, US 2011/032502 and US2010/208264 disclose methods and devices for measuring the polarization state in projection exposure apparatuses, wherein all the documents propose the use of transmissive elements such as, for example, beam splitters, polarizers, retardation elements and the like. However, the use of transmissive elements is suitable only to a limited extent for the EUV range, since said elements lead to a reduction of the light intensity, with the result that longer integration times are necessary for a measurement. Furthermore, said documents use in some instances methods in which polarizers and the like are rotated in different orientations (see e.g. US2010/208264), which is likewise time-consuming.

The known polarization measuring devices are therefore relatively complex and, e.g. on account of their use of transmissive elements, suitable only to a limited extent for use in the EUV range.

EP 1306665A2 discloses an optical apparatus for measuring polarization including a rotary polarizer including a set of mirrors repeating three or more reflections and arranged such that the optical axes of incident and of the outgoing light are aligned with the same straight line. Polarization measurement devices with rotating reflective plates are also disclosed in DE 10347978 A1 and U.S. Pat. No. 4,725,145.

SUMMARY

It is therefore an object of the present invention to provide a polarizing measuring device which is suitable for the EUV range and which can be provided with comparatively little outlay and which enables a rapid polarization measurement.

This object is achieved with a polarization measuring device for determining the polarization of a light beam, comprising a reflector for reflecting the light beam, wherein the reflector is configured in such a way that the plane of incidence of the light rays in the light beam varies in a location-dependent manner, such that the reflector reflects differing polarization components of the light beam to different extents depending on the plane of incidence; and a detector for detecting the differing polarization components.

With this polarization measuring device, the polarization of a light beam can be determined using exclusively reflective elements, such that the polarization measuring device is also suitable for operation in the EUV range. In particular, a reduction of the light intensity at the detector is smaller than would be the case with the use of transmissive elements, with the result that it is possible to achieve a precise measurement with short measurement times. Furthermore, the construction of the polarization measuring device is comparatively simple, with the result that it can be realized relatively cost-effectively. Furthermore, since the plane of incidence of the light rays in the light beam varies in a location-dependent manner, the polarization measuring device can be configured without any movable (e.g. rotating) elements, with the result that the polarization measurement can be carried out rapidly.

The fact that differing polarization components of the light beam are "reflected to different extents" can mean, for example, that a larger proportion of a first polarization component is reflected than that of a second polarization component, the direction of polarization of which is perpendicular to the first polarization component. In other words, the reflectance for differently polarized components differs in magnitude. In this case, a high extinction ratio is advantageous, that is to say that e.g. in a location-dependent manner the ratio of the quantity of light of the reflected first polarization components to the quantity of light of the reflected second polarization components is at least 8:1, preferably at least 9:1.

In one exemplary embodiment, the reflector has a curved reflecting surface. In the case of a curved reflecting surface, the polarization measuring device can be arranged such that the plane of incidence varies continuously along the direction of the curvature (e.g. the azimuthal direction). Accordingly, a polarization measuring device with a high resolution can be attained. Examples of reflectors having a curved reflecting surface are conical reflectors and semi-spherical reflectors. Thus, with a comparatively simple geometrical shape it is possible to realize a reflector in which the plane of incidence of the light rays in the light beam varies uniformly in an azimuthal direction.

Alternatively, it is also possible that the reflector is pyramidal. Here, "pyramidal" means the shape of a solid with a polygonal base (in particular, a regular polygonal base) and triangular faces that meet at a common point, namely the vertex of the pyramidal shape. The number of triangular faces may be e.g. four or a multiple of four, but there is no limitation to this. Such a pyramidal reflector is comparatively easy to manufacture.

In one possible embodiment, the reflector is stationary. With such an arrangement, the polarization measuring device does not have to be provided with moving parts.

The detector can be arranged around the reflector. In this case, the detector can be circular or polygonal.

A particularly high extinction ratio of the differing polarization components results if the reflector is arranged in such a way that the light beam impinges on the reflector substantially at the Brewster angle.

Furthermore, the polarization measuring device can comprise a first reflector (corresponding to the reflector mentioned above) on which the light beam is incident and a second reflector, which reflects the light reflected by the first reflector before it impinges on the detector. Consequently, an even higher extinction ratio of the differing polarization components can be achieved. The second reflector can be arranged for example in a ring-shaped fashion around the first reflector. In this case, the detector can be embodied as a planar detector that is arranged in a plane which intersects the light rays reflected by the second reflector.

The polarization measuring device can furthermore comprise a mechanism configured to guide the light beam in a circulating manner around the vertex of the reflector, and an evaluation unit for integrating the light intensity detected by the detector. Consequently, it is also possible to measure the polarization of a non-circular light beam.

A similar effect can be obtained if the polarization measuring device furthermore comprises an arrangement configured to carry out a plurality of polarization measurements for different positions of incidence of the light beam on the reflector, and an evaluation unit for averaging the results of the individual polarization measurements.

In an alternative embodiment, the reflector can be rotatable about the optical axis of the light beam. Consequently, it is possible to realize a reflector in which the plane of incidence of the light rays in the light beam varies over time.

A lithography apparatus according to a further embodiment comprises a polarization measuring device for determining the polarization of a light beam, the polarization measuring device comprising a reflector for reflecting the light beam, wherein the reflector is configured in such a way that the plane of incidence of the light rays in the light beam varies in a location- or time-dependent manner, such that the reflector reflects differing polarization components of the light beam to different extents depending on the plane of incidence, and a detector for detecting the differing polarization components. The polarization measuring device may have any of the features described above.

The lithography apparatus may be for example an EUV lithography apparatus, and the polarization measuring device may be provided in order to determine the polarization of the EUV light used in the EUV lithography apparatus. By way of example, such a lithography apparatus can comprise a field facet mirror arrangement having a plurality of field facet mirrors, and a pupil facet mirror arrangement having a plurality of pupil facet mirrors, wherein at least one pupil facet mirror is assigned to each of the field facet mirrors. The polarization measuring device can then be provided on the pupil facet mirror arrangement. If the field facet mirrors are tiltable, the position of the light beam on the polarization measuring device can be adjusted by the tilting of the field facet mirrors.

It is also possible to provide a plurality of the above-described polarization measuring devices on the pupil facet mirror arrangement. In this case, a plurality of channels corresponding to the individual field facet mirrors can be measured simultaneously.

Furthermore, the polarization measuring device can be provided in a measuring device for measuring imaging properties (such as e.g. the polarization properties) of an imaging system. Such a measuring device comprises for example a stop having a pinhole, through which the light shaped by the imaging system passes, a mirror for reflecting the light passing through the pinhole, and a detector for detecting the light reflected by the mirror. The polarization measuring device can be arranged between the mirror and the detector. In this case, the imaging system can be for example a mask metrology apparatus or an illumination system of a lithography apparatus, in particular of an EUV lithography apparatus.

A polarization measuring method for determining the polarization of a light beam uses a polarization measuring device as described above, wherein the light beam is guided around the cone vertex of the conical reflector. With such a method it is also possible to precisely determine the polarization of non-circular light beams (that is to say independently of the spot shape).

The light beam can be guided in a circulating manner around the cone vertex of the conical reflector, and the light intensity detected by the detector can be integrated. In this case, the radius of the circle through which the light beam is guided can correspond to at least half of the maximum diameter (extent of the cross section) of the light beam. As an alternative thereto, a plurality of polarization measurements can be carried out for different positions of incidence of the light beam on the reflector, and the result of the individual polarization measurements can be averaged. In this case, the positions of incidence of the light beam on the reflector can correspond to the vertices of a regular polygon.

Furthermore, in such a polarization measuring method, the polarization measuring device can be provided in a lithography apparatus as described above, and the light beam can be guided around the cone vertex of the reflector by the actuation of one of the field facet mirrors.

Further exemplary embodiments will be explained with reference to the accompanying drawings.

DETAILED DESCRIPTION

Unless indicated otherwise, identical reference signs in the figures designate identical or functionally identical elements. Furthermore, it should be taken into consideration that the illustrations in the figures are not necessarily true to scale.

First Exemplary Embodiment

Figure 1:
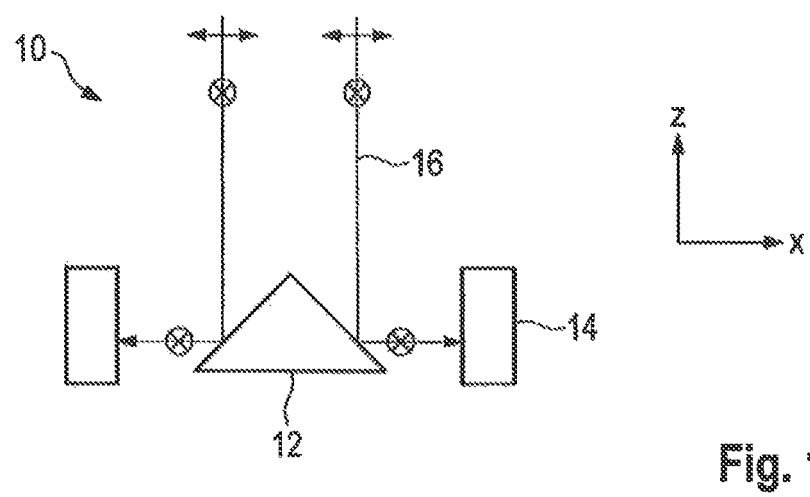
FIG. 1 shows a schematic view of a polarization measuring device in accordance with a first exemplary embodiment.

FIG. 1 is a schematic view of a polarization measuring device 10 in accordance with a first exemplary embodiment. The polarization measuring device 10 illustrated in FIG. 1 comprises a conical reflector 12 and a ring detector 14.

The reflector 12 has a circular base surface and a conical (i.e. curved) reflective surface. The conical reflector 12 is reflective in a specific wavelength range, e.g. in the EUV (Extreme UltraViolet) range. A reflector 12 that is reflective in the EUV range can be produced from a quartz cone, for example, to the surface of which a reflective monolayer or multilayer is applied. A suitable multilayer can consist e.g. of alternate thin layers of molybdenum and silicon which are dimensioned such that a high reflectivity in the EUV range is obtained. However, EUV reflectors are not restricted to such an arrangement, and generally any material is suitable with which a sufficient reflectivity in the EUV range can be obtained. Furthermore, the cone angle of the conical reflector 12 is substantially 90 degrees in the case of a EUV reflector, since in this case a light beam directed at the cone vertex perpendicularly from above impinges on the reflective surface of the reflector 12 substantially at the Brewster angle. It should be taken into account here that the Brewster angle is exactly 45 degrees in the case of a reflective medium having a refractive index of n=1. In the case of typical layer materials or layer designs, the Brewster angle is somewhat smaller and can be approximately 43 degrees, for example. The cone angle should be configured accordingly. Expressed in general terms, the cone angle of the conical reflector 12 is adapted to the wavelength of the light beam to be measured such that the light beam directed at the cone vertex perpendicularly from above impinges on the reflective surface of the reflector 12 substantially at the Brewster angle, that is to say for example at the Brewster angle ±10 degrees or preferably at the Brewster angle ±5 degrees.

The detector 14 is ring-shaped and is arranged around the reflector 12. The schematic illustration in FIG. 1 is therefore rotationally symmetrical about the z-axis. The detector 14 can be designed for example as a CCD detector or CMOS detector or the like.

A light beam 16 consisting of substantially parallel individual light rays is directed onto the polarization measuring device 10. The light beam 16 impinges substantially centrally on the cone vertex of the conical reflector 12. The individual light rays are reflected by the reflector 12 in accordance with the law of reflection (angle of incidence equals angle of reflection), wherein each light ray incident on the reflector 12 together with the reflected light ray defines a plane of incidence. On account of the cone shape of the reflector 12, the direction of the reflected light rays depends on the location at which the incident light rays impinge on the reflector 12. In other words, the plane of incidence of the individual light rays in the light beam 16 (or to put it more simply the plane of incidence of the light beam 16) therefore varies in a location-dependent manner.

In the example illustrated in FIG. 1, the light beam is not polarized, that is to say that it comprises p-polarized components whose polarization lies in the plane of incidence, and s-polarized components whose polarization lies perpendicular to the plane of incidence of the light beam 16 (or of the light rays contained therein) on the reflector 12. The p-polarized components are indicated by double-headed arrows and the s-polarized components are indicated by crosses. If the light beam 16 impinges on the reflector 12 substantially at the Brewster angle, then principally (that is to say preferably) the s-polarized components are reflected, that is to say those polarization components which are parallel to the surface of the reflector 12. Consequently, at each location of the reflector 12, differing polarization components are reflected to different extents. In this case, the preferably reflected polarization components are not identical at every location of the reflector 12, but rather change along the extent of the reflector 12.

By evaluating the light detected by the detector 14, it is thus possible to detect the polarization of the light beam 16. In the example illustrated in FIG. 1, the light beam 16 is unpolarized, with the result that the detector 14 detects the same quantity of light at every location. By contrast, if the light beam 16 is polarized in the plane of the drawing in FIG. 1 (corresponding to the double-headed arrows), then the light is preferably reflected at those locations of the reflector 12 at which the direction of polarization is parallel to the surface of the reflector 12. An intensity distribution in the light detected by the detector 14 thus results, from which the direction of polarization can be deduced. This will be explained in even greater detail in the following exemplary embodiments.

Second Exemplary Embodiment

Figure 2A:
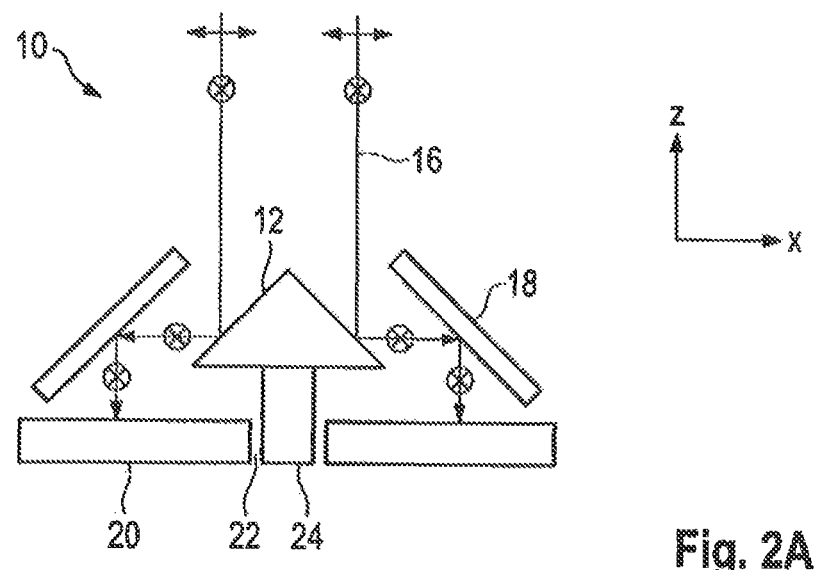
FIG. 2A and FIG. 2B show the polarization measuring device and the light intensity detected by the detector for the case where the incident light beam is not polarized.
Figure 2B:
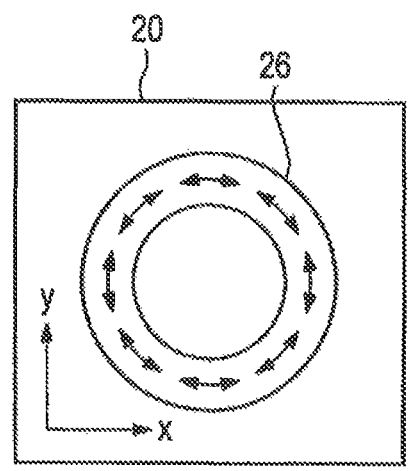
Figure 3A:
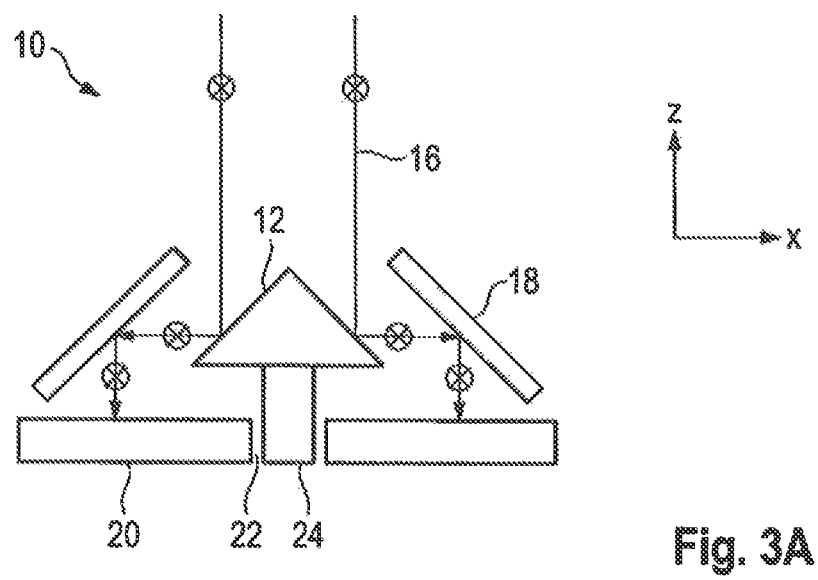
FIG. 3A and FIG. 3B show the polarization measuring device and the light intensity detected by the detector for the case where the incident light beam is polarized in the y-direction.
Figure 3B:
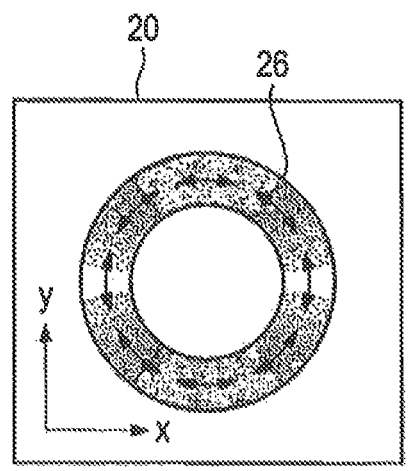
Figure 4A:
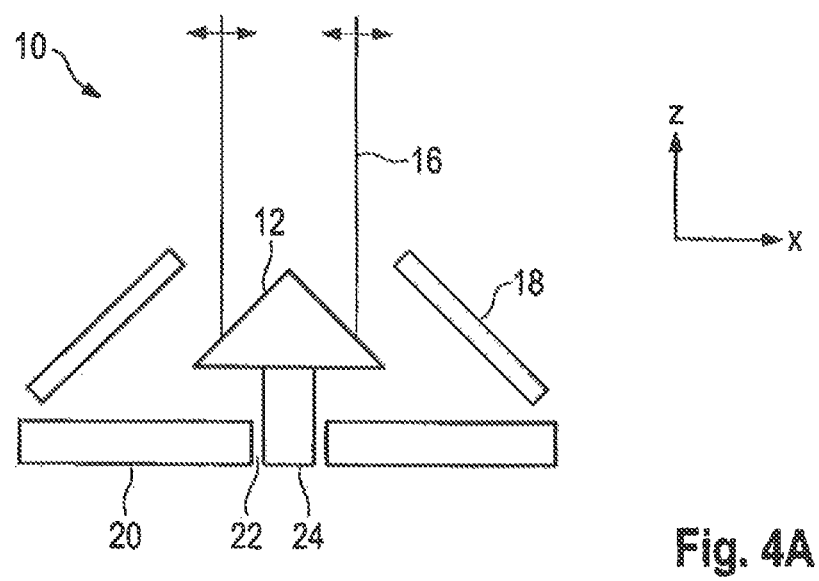
FIG. 4A and FIG. 4B show the polarization measuring device and the light intensity detected by the detector for the case where the incident light beam is polarized in the x-direction.
Figure 4B:
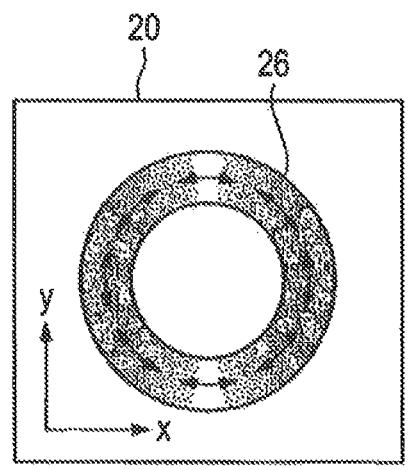

FIGS. 2 to 4 schematically show a polarization measuring device 10 in accordance with a second exemplary embodiment, and the light detected by the detector of the polarization measuring device 10. FIG. 2A and FIG. 2B show the polarization measuring device 10 and the light intensity detected by the detector for the case where the incident light beam 16 is not polarized. FIG. 3A and FIG. 3B show the polarization measuring device 10 and the light intensity detected by the detector for the case where the incident light beam 16 is polarized in the y-direction. FIG. 4A and FIG. 4B show the polarization measuring device 10 and the light intensity detected by the detector for the case where the incident light beam 16 is polarized in the x-direction.

The polarization measuring device 10 illustrated in FIGS. 2A to 4A differs from the polarization measuring device 10 of the first exemplary embodiment in that the light rays reflected by the reflector 12 are deflected by a ring-shaped reflector 18 before they impinge on a planar detector 20. In this case, the reflector 12 corresponds to the reflector 12 of the first exemplary embodiment and will therefore not be explained in greater detail.

The planar detector 20 is arranged below the reflector 12, that is to say opposite the circular base surface thereof, which detector can likewise be embodied as a CCD detector, a CMOS detector or the like.

The ring-shaped reflector 18 is arranged around the reflector 12 and can be produced from the same material as the latter. In this case, the inner surface of the ring-shaped reflector 18 is inclined inward such that the light rays reflected by the reflector 12 impinge on said surface once again substantially at the Brewster angle. If the light beam 16 is in the EUV range, the inner surface is therefore inclined inward for example substantially by 45 degrees. The reflective inner surface is therefore likewise conical, or has the shape of a truncated cone. The ring-shaped reflector 18 can be dimensioned such that all the light rays reflected by the reflector 12 are reflected again by said ring-shaped reflector 18 before they impinge on the planar detector 20. Consequently, the vertical extent of the ring-shaped reflector 18 is at least at the same magnitude as the vertical extent of the reflector 12.

The light rays reflected by the reflector 12 in each case impinge at a location of the ring-shaped reflector 18 whose surface is parallel to the opposite surface of the reflector 12. Consequently, the polarization components extinguished by this second reflection at the ring-shaped reflector 18 are the same as those extinguished by the first reflection at the reflector 12. A higher extinction ratio (Ts/Tp) of the p-polarized components is thus achieved, which can increase the measurement accuracy.

Furthermore, a planar detector 20 can be used in this exemplary embodiment, said planar detector being significantly simpler to produce than the ring-shaped detector 14 of the first exemplary embodiment. In this case, the detector 20 can cover for example those regions on which the light rays reflected by the reflector 18 impinge. In this case, it suffices if the detector 20 covers a narrow ring-shaped region with which the light intensity can be determined at every azimuthal position. However, it is also possible for the detector to extend in the manner of a CCD camera in a whole-area fashion over substantially the entire region located below the reflector 12 or at least over the region located between the reflector 12 and the lower edge of the ring-shaped reflector 18.

The detector 20 is provided with a circular through-hole 22, the extent of which is smaller than the base surface of the reflector 12. A mount 24 is led through said through-hole 22, with which mount the reflector 12 can be fixed to a frame element or the like, not illustrated in more specific detail. The detector 20, too, can be fixed to said frame element.

If the incident light beam 16 is not polarized, then the components (s-components) polarized perpendicularly to the plane of incidence are in each case reflected along the extent of the reflector 12, said components being uniformly distributed along the extent of the reflector 12. Consequently, the light intensity detected by the detector 20 is also homogeneous along the azimuthal direction, see FIG. 2B. In this case, the measurement region 26 of the detector 20 in FIG. 2B is ring-shaped, and the double-headed arrows indicate the tangential polarization of the light impinging on the detector 20.

Figure 5:
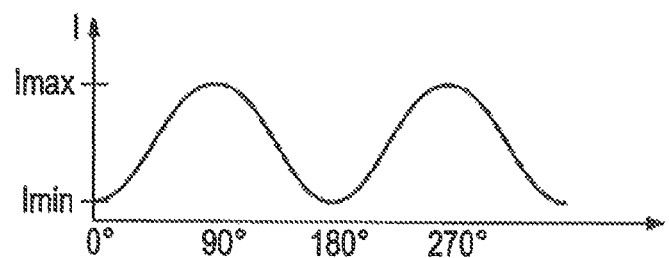
FIG. 5 shows a graph representing the intensity distribution on the detector in an azimuthal direction.

By contrast, if the light beam 16 is polarized in the y-direction, as illustrated in FIG. 3A, then preferably those light rays whose plane of incidence is the x-z plane are reflected by the reflector 12. By contrast, light rays whose plane of incidence is the y-z plane are almost completely extinguished. For the plane of incidence situated therebetween, the reflection is greater (or the extinction is weaker), the nearer the plane of incidence is to the x-z plane. The two-fold intensity distribution illustrated in FIG. 3B thus arises on the detector 20. FIG. 5 shows this intensity distribution as a graph, wherein the x-axis marks the angle (proceeding from 0 degrees in the 12 o'clock position in FIG. 3B), and the y-axis marks the light intensity. A substantially $\sin^2$-shaped intensity distribution having maxima at the angles 90 degrees and 270 degrees and minima at the angles 0 degrees and 180 degrees thus results. Accordingly, if the light beam 16 is polarized in the x-direction, as illustrated in FIG. 4A, then preferably those light rays whose plane of incidence is the y-z plane are reflected by the reflector 12. A substantially $\cos^2$-shaped intensity distribution having maxima at the angles 0 degrees and 180 degrees and minima at the angles 90 degrees and 270 degrees thus results, cf. FIG. 4B.

By evaluating the intensity distribution it is possible to determine the polarization state of the light beam 16. For this purpose, the detector signal generated by the detector 20, said signal representing the intensity distribution, is fed to an evaluation unit (not illustrated in more specific detail). In this regard, by determining the azimuth angles of the intensity maxima, the evaluation unit can determine the polarization orientation corresponding to the orientation of the intensity maxima. Furthermore, the evaluation unit can also determine the degree of polarization (also designated as "DoP"), which is given by:

$$DoP = \frac{I_{min} - I_{max}}{I_{min} + I_{max}} \tag{1}$$

In equation (1), Imin denotes the minimum light intensity and Imax denotes the maximum light intensity on the detector 20, cf. FIG. 5.

No transmissive elements but rather exclusively reflective elements are used in the polarization measuring device 10 described above. Consequently, this polarization measuring device 10 is particularly well suited to operation in the EUV range. To put it more precisely, the device described can prevent the light intensity from being reduced on account of absorption by transmissive optical elements.

Furthermore, different polarizations are associated with different regions on the detector 14. Accordingly, it is not necessary to "sweep through" a range of angles of incidence, as is necessary in conventional devices including a rotary reflecting member. One advantage of this is that it is not necessary to provide moving parts, such as a rotary mechanism for rotating the reflector. A further advantage is that it is possible to obtain the measurement result instantaneously.

In order to obtain an accurate measurement result, a point-symmetrical intensity distribution should be present on the measurement region 26 of the detector 20. This is the case for example if the light beam 16 impinges centrally on the reflector 12, that is to say in such a way that its centroid ray impinges on the vertex of the conical reflector 12.

Figure 6A:
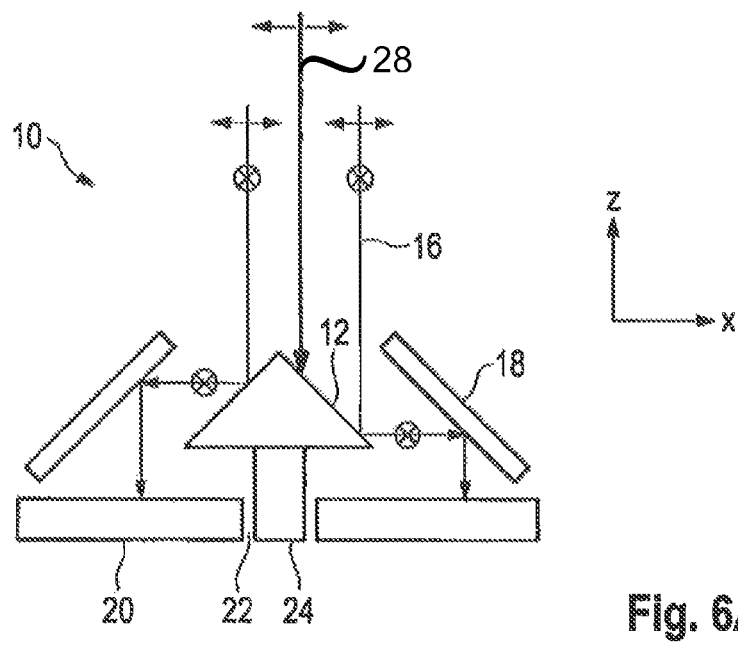
FIG. 6A shows a polarization measuring device on which a light beam impinges non-centrally.
Figure 6B:
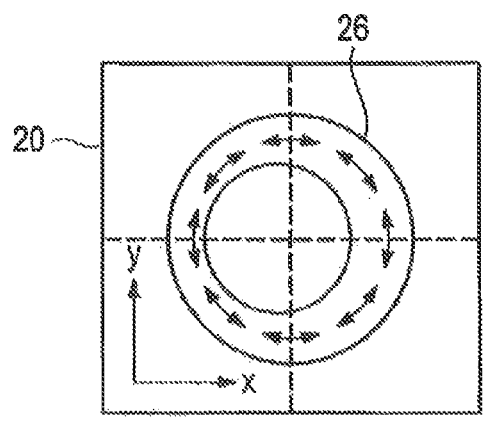
FIG. 6B shows the light intensity detected by the detector for this case.

FIG. 6A shows a polarization measuring device 10 on which a light beam 16 impinges non-centrally, and FIG. 6B shows the light intensity detected by the detector for this case. In the case illustrated, the centroid ray 28 of the light beam 16 does not impinge on the cone vertex of the reflector 12, but rather impinges on the reflector 12 in a manner slightly offset from the cone vertex. Consequently, the distribution of the light intensity is not uniform in the azimuthal direction, which can lead to measurement errors. In order to minimize such measurement errors, therefore, before the actual measuring process, it is possible to carry out an alignment in which the polarization measuring device 10 and the light beam 16 are aligned with respect to one another. It should be taken into consideration that FIGS. 2 to 4 relate to the case where the polarization measuring device 10 and the light beam 16 are ideally aligned with respect to one another.

Generally, the alignment can be effected by the polarization measuring device 10 being moved in relation to the stationary light beam 16, or conversely by the light beam 16 being aligned in relation to the stationary polarization measuring device 10. Methods in which both the polarization measuring device 10 and the light beam 16 are moved are also possible.

One possible realization of an alignment in which the polarization measuring device 10 is moved in relation to the stationary light beam 16 can be achieved by the polarization measuring device 10 being mounted on a movement table with which it can be moved in the x-direction and in the y-direction. The alignment process can be carried out using unpolarized light, such that the same light intensity should be present in the case of ideal alignment. An alignment algorithm can be provided, for example, for determining the difference between the light intensities at given azimuth angles α and the light intensities of the opposite angles α+180 and for displacing the polarization measuring device 10 in the direction for which said difference is the greatest. Not necessarily the entire polarization measuring device 10 need be displaced; it is also possible that just the reflector 12 is displaced by being mounted on a movement table or the like.

Furthermore, in order to ensure that the light beam 16 impinges on the reflector 12 perpendicularly, a tilting mechanism can be provided which can be used to tilt the polarization measuring device 10 about the x-direction and the y-direction.

The following exemplary embodiment describes an arrangement in which the light beam 16 is aligned in relation to the stationary polarization measuring device 10.

Third Exemplary Embodiment

A third exemplary embodiment of the invention is explained below with reference to FIGS. 7 to 9.

Figure 7:
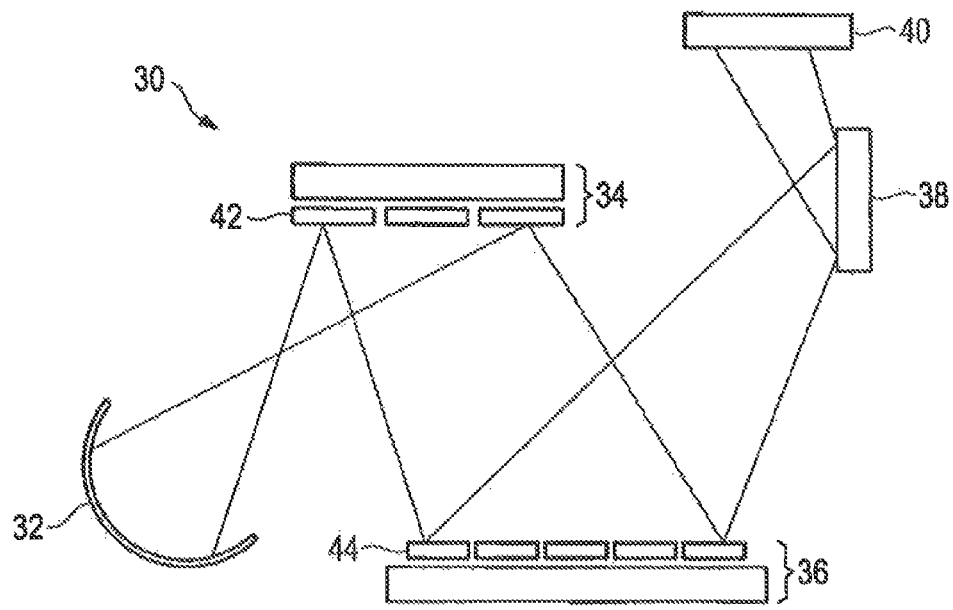
FIG. 7 shows an illumination system of an EUV lithography apparatus.
Figure 8:
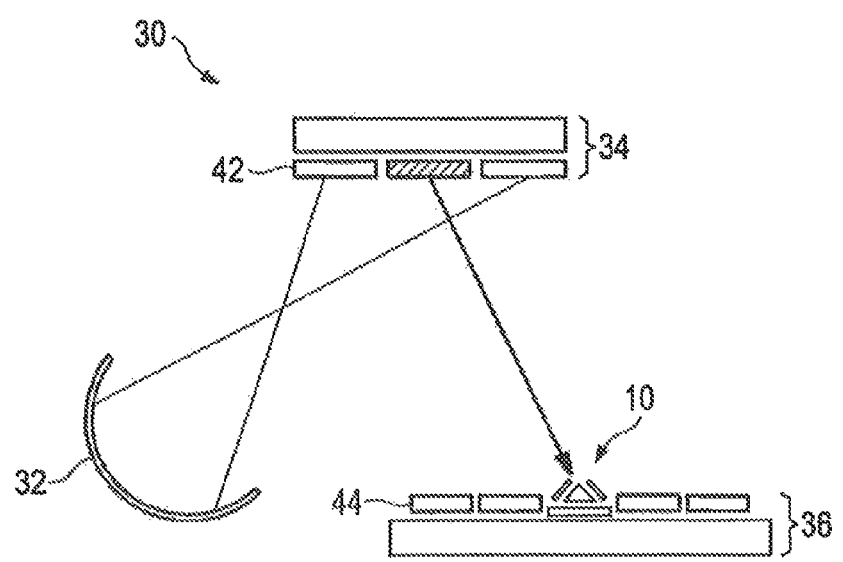
FIG. 8 shows a schematic illustration of an illumination system comprising a polarization measuring device according to the invention.
Figure 9:
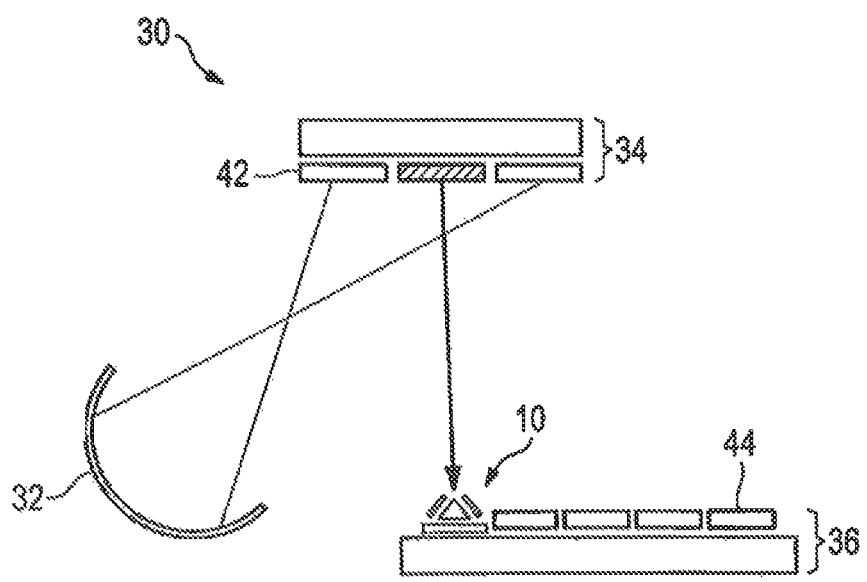
FIG. 9 shows a schematic illustration of an illumination system comprising a polarization measuring device according to the invention.

FIGS. 7-9 show schematic illustrations of an illumination system 30 of an EUV lithography apparatus. The illumination system 30 comprises an EUV light source 32 (merely illustrated schematically) with collector, a field facet mirror arrangement 34, a pupil facet mirror arrangement 36 and a mirror 38. The illumination system 30 can be provided in a vacuum housing that can be evacuated with the aid of an evacuation device (not illustrated in more specific detail).

The EUV light source 32 can comprise for example a plasma source (or, as an alternative thereto, a synchrotron) and also a collimator and a monochromator. The plasma source emits radiation in the EUV range (extreme ultraviolet range), that is to say e.g. in the wavelength range of 5 nm to 20 nm. The radiation emerging from the plasma source is firstly concentrated by the collimator, after which the desired operating wavelength is filtered out by the monochromator. The wavelength and the spatial distribution of the light emitted by the EUV light source 32 are thus adapted.

The field facet mirror arrangement 34 has a plurality of field facet mirrors 42 (also called "FF mirrors") which are arranged along the surface of the field facet mirror arrangement 34 and reflect the light emitted by the EUV light source 32. The field facet mirrors 42 can be planar or curved. The pupil facet mirror arrangement 44 also has a plurality of pupil facet mirrors 44 (also called "PF mirrors") which are arranged along the surface of the pupil facet mirror arrangement 36 and reflect the light reflected by the field facet mirrors 42.

The light reflected by the PF mirrors 44 is directed onto the mask 40 by the mirror 38. The mask 40 can be embodied as reflective or transmissive, and the light reflected or transmitted by the mask 40 can be directed via a projection system (not illustrated in more specific detail) onto a wafer or the like in order that structures provided in the mask 40 are imaged in a reduced fashion thereon.

Each of the FF mirrors 42 is assigned at least one of the PF mirrors 44, which reflects the light emanating from said FF mirror 42. In this case, the individual field facet mirrors 42 and the PF mirrors 44 assigned thereto are embodied and positioned in such a way that they form an imaging of the EUV light source 32 at the same position on the image plane. A uniform field distribution of the light from the EUV light source 32 on the image plane is thus achieved.

The individual FF mirrors 42 are actuable with respect to at least one degree of freedom and can in particular be tilted relative to one another. By way of example, the individual FF mirrors 42 can be tiltable between two orientations assigned in each case to different PF mirrors 44. Different illumination states can thus be achieved. Likewise, the PP mirrors 44 can also be actuable. Furthermore, the field facet mirror arrangement 34 and the pupil facet mirror arrangement 36 can also be alignable in their entirety.

In one configuration of the invention, the actuability of the FF mirrors 42 is utilized in order to enable the polarization measuring device 10 to be aligned without additional actuators. FIG. 8 shows a schematic illustration of an illumination system 30 comprising a polarization measuring device 10 according to the invention. In this case, the light emitted by the EUV light source 32 is reflected by one of the FF mirrors 42 (illustrated with hatching here) and directed onto a polarization measuring device 10 provided substantially centrally on the pupil facet mirror arrangement 36. The polarization measuring device 10 is provided instead of one of the PF mirrors 44 and detects the degree of polarization and the polarization orientation of the channel associated with said FF mirror 42 in the manner described above. In this case, the polarization measuring device 10 can be configured in a tiltable fashion and can be tilted such that the light beam emanating from the FF mirror 42 impinges on the polarization measuring device 10 substantially perpendicularly, that is to say that the centroid ray of the light beam impinges centrally on the cone vertex of the reflector 12. Furthermore, the alignment described above can also be carried out before the actual polarization measurement. In this case, the actuability of the FF mirrors 42 is utilized, and the FF mirror 42 is aligned with a corresponding closed-loop control such that a point-symmetrical intensity distribution is present on the measurement region 26 of the detector 20. For this alignment, the FF mirrors 42 should be tiltable at least about the x-axis and about the y-axis.

After the measurement process has been carried out, the measured FF mirror 42 is tilted such that the light beam reflected by it no longer impinges on the polarization measuring device 10. Instead, a different FF mirror 42 is tilted such that the light beam reflected by it impinges on the polarization measuring device 10, and the channel of said different FF mirror 42 is measured in relation to the polarization.

Depending on the actuability of the FF mirrors 42, it is possible to measure a plurality of the FF mirrors 42 with only one polarization measuring device 10 provided in a fixed fashion. By way of example, if all the FF mirrors 42 are tiltable arbitrarily (that is to say e.g. about three axes), then it is possible to measure all the FF mirrors 42 with only one fixed polarization measuring device 10. By contrast, if the FF mirrors 42, as described above, are tiltable only about one axis, then it is possible to measure a plurality of the FF mirrors 42, to put it more precisely namely the FF mirrors 42 arranged on an axis situated perpendicular to the tilting axis, with a fixed polarization measuring device 10. In order that all the FF mirrors 42 provided two-dimensionally on the FF mirror arrangement 34 are measured in this case, either a plurality of fixed polarization measuring devices 10 can be provided at suitable positions, or the polarization measuring device 10 or the PF mirror arrangement 36 can be configured to be displaceable over a specific range.

The arrangement described here utilizes the actuability of the FF mirrors 42 in order to measure the channels of in each case a plurality of FF mirrors 42 with only one polarization measuring device 10. In this case, there is no need to provide separate actuators in order to align the polarization measuring device 10.

The polarization measuring device 10 need not necessarily be provided centrally on the PF mirror arrangement 36. By way of example, it can also be provided at the edge of the PF mirror arrangement 36, as is illustrated in FIG. 9. Given corresponding actuability of the FF mirrors 42, one or more polarization measuring devices 10 can also be provided outside the region in which the PF mirrors 44 are provided. This has the advantage that none of the PF mirrors 44 has to be exchanged for a polarization measuring device 10 in order to carry out a measurement process. This also makes it possible to carry out measurement processes on site after the EUV lithography apparatus has been started up.

The arrangement of the polarization measuring device 10 in the illumination system 30, as presented here, is merely by way of example, and the polarization measuring device 10 can, of course, also be arranged at other locations in the beam path of the EUV lithography apparatus, in particular also between the mask 40 and the wafer stage.

Fourth Exemplary Embodiment

In the exemplary embodiment illustrated in FIGS. 7 to 9, the spot reflected from the FF mirrors 42 onto the PF mirrors 44 is not necessarily circular. Rather, the FF mirrors 42 are typically rectangular or the like and can be embodied as concave mirrors, such that the spot impinging on the PF mirrors 44 (that is to say the cross section through the light beam 16) is correspondingly rectangular, reniform, circle-arc-shaped or the like. In this case, centering on the cone vertex of the reflector 12 is possible with difficulty or not possible at all, and so the intensity distribution on the detector 20 is not point-symmetrical.

Figure 10A:
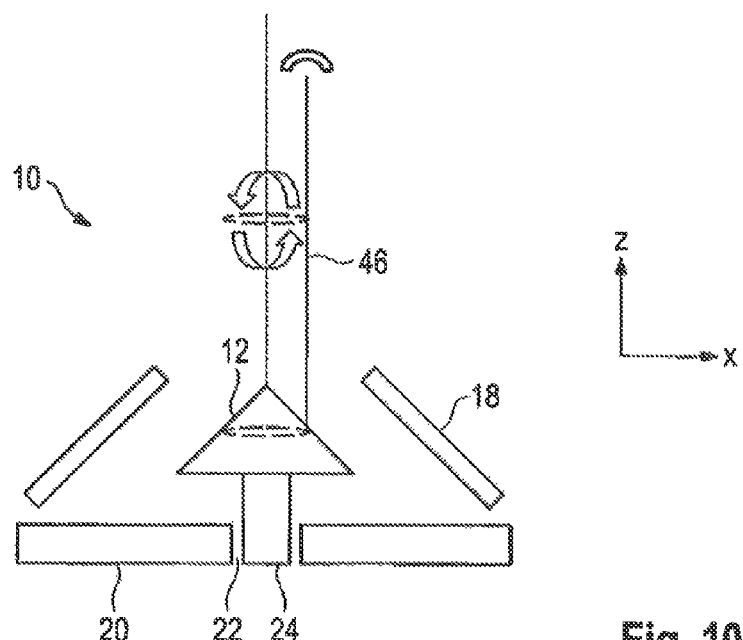
FIGS. 10A, 10B schematically illustrate a device and a method for measuring the polarization of a non-circular light beam.
Figures 10B, 11:
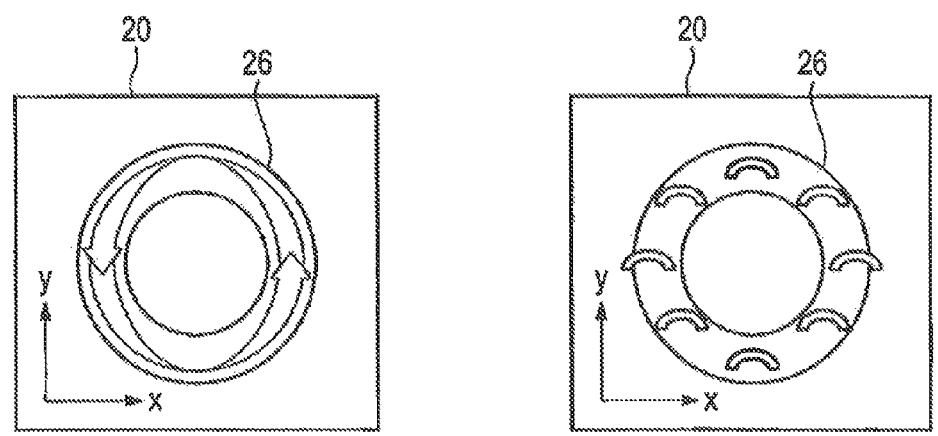
FIG. 11 schematically illustrates a further method for measuring the polarization of a non-circular light beam.

FIGS. 10A, 10B and 11 schematically show a device and a method for measuring the polarization of a non-circular light beam. FIG. 10A in this case shows a polarization measuring device 10 which substantially corresponds to the polarization measuring device 10 illustrated in FIGS. 2 to 4 and can be incorporated into an EUV illumination system 30, as illustrated in FIGS. 7 to 9. In contrast to FIGS. 2 to 4, however, in this case the incident light beam 46 is not circular, but rather reniform or circle-arc-shaped, for example, as indicated schematically in FIG. 10A, and in particular is not point-symmetrical.

In a first configuration of this exemplary embodiment, then, the FF mirrors 42 of the illumination system 30 are actuated such that the light beam 46 to be measured circulates above or around the cone vertex of the reflector 12, that is to say, in other words, is guided in a circular movement around the cone vertex of the reflector 12. At the same time, the light intensity of the light rays reflected by the reflector 12 is detected by the detector 20. The light intensity detected by the detector 20 is then integrated, for example by a detector signal that is generated by the detector 20 being fed to an evaluation unit (not illustrated in more specific detail) and being integrated there, if appropriate after digitization. As an alternative thereto, integration through circuitry on the detector 20 itself is also possible. During the circular movement it is advantageous if the offset of the light beam 46 in the radial direction (that is to say the radius of the circle through which the light beam 46 is guided) corresponds to at least half of the maximum extent of the spot in the x-y plane. This ensures that all portions of the light beam pass through all azimuthal angles on the reflection surface of the reflector 12, with the result that a uniform intensity distribution (in the case of an unpolarized light beam 46) is obtained. In this case, the FF mirrors 42 constitute, if appropriate in conjunction with an associated controller, a mechanism configured to guide the light beam in a circulating manner around the cone vertex of the conical reflector.

In a second configuration of this exemplary embodiment, no integration of the light intensity detected by the detector 20 is performed, rather a plurality of measurements are performed for different spot positions on the reflector 12. This is illustrated schematically in FIG. 11. The spot positions on the reflector 12 in this case correspond to vertices of a regular polygon which lie on a circle, e.g. the circle in which the light beam 46 is moved over the reflector. Preferably, at least four, particularly preferably at least eight or at least 16 measurements are performed. The results of this individual measurement can then be averaged in order thus to obtain a more uniform intensity distribution. In this case, the light beam 46 can be moved in a circle around the cone vertex of the reflector, as described above, by the actuation of the FF mirrors 42. However, it is also possible to move directly to the individual measurement positions, that is to say to move the light beam 46 in the form of a polygon around the cone vertex of the reflector 12. In this case, the FF mirrors 42 constitute, if appropriate in conjunction with an associated controller, an arrangement configured to carry out a plurality of polarization measurements for differing positions of incidence of the light beam on the reflector.

With the method described above, it is also possible for light beams that do not have a circular cross section to be measured with high accuracy with regard to their polarization, wherein the actuator system of the FF mirrors 42 is utilized, and so there is no need to provide additional actuators.

Fifth Exemplary Embodiment

The polarization measuring device presented here is suitable not just for lithography apparatuses. In this regard, mask metrology apparatuses are becoming increasingly important in microstructure engineering.

For the production of an integrated circuit, 40 or more different masks may be required in order to pattern the different material layers on the wafer. A complete mask set is very complex to produce and correspondingly costly. In this case, even tiny faults in a mask can lead to defects on the circuits produced. Therefore, it is important to identify mask faults at an early stage. Furthermore, it is also possible to carry out continual quality inspections, if appropriate, in conjunction with a repair of defective masks.

A mask metrology apparatus for quality inspection or measurement of masks can have, from the light source to the mask, a construction similar to a lithography apparatus and can comprise, in particular, an illumination system similar to that in FIGS. 9 to 11. However, the mask structure is not imaged in a reduced fashion on the wafer, but rather is imaged for example in a magnified fashion by a suitable lens on a detector, such as e.g. a CCD detector, which detects the mask structure.

Figure 12:
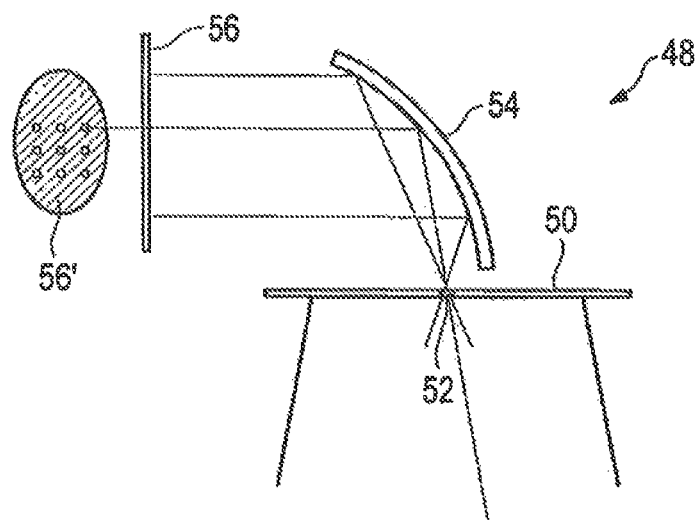
FIG. 12 is a schematic illustration of a section of a mask metrology apparatus.

FIG. 12 is a schematic illustration of a measuring device which can be used in a conventional mask metrology apparatus 48. In this case, FIG. 12 shows that section of the mask metrology apparatus 48 which follows the mask. The apparatus in FIG. 12 is configured to detect an illumination pupil of the mask metrology apparatus 48. The illumination system can correspond to the illumination system 30 in FIG. 7 and is therefore not illustrated in more specific detail. The mask 40 is replaced by a stop 50 having a pinhole 52. Furthermore, the mask metrology apparatus 48 has a Fourier mirror 54 and a detector 56.

The light from the illumination system 30 that passes through the pinhole 52 is reflected by the Fourier mirror 54 and imaged on the detector 56. In this case, the Fourier mirror 54 serves to produce the transition from the field plane to the pupil plane. The image of the illumination pupil is detected by the measurement region 56' of the detector 56, as indicated schematically in FIG. 12.

Figure 13:
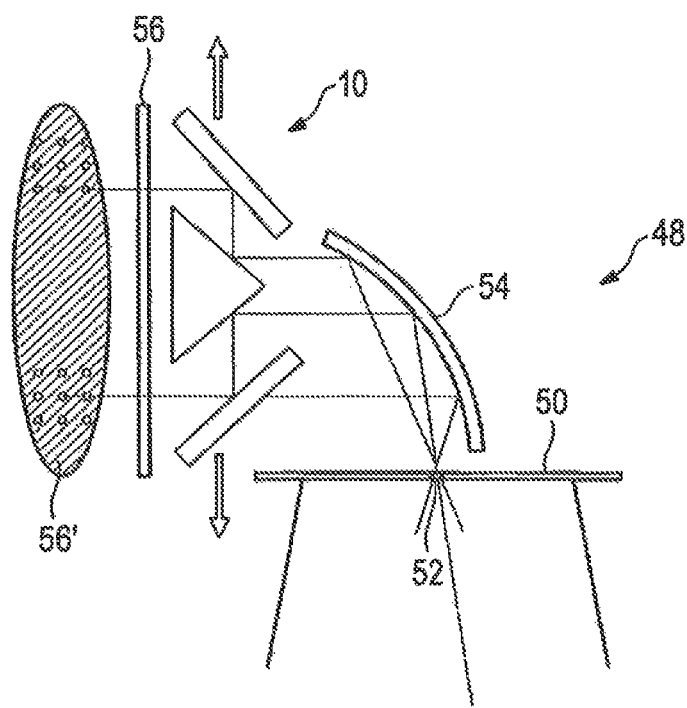
FIG. 13 is a schematic illustration of a section of a mask metrology apparatus comprising a polarization measuring device.

An inventive polarization measuring device 10 can be integrated into the above-described mask metrology apparatus 48 relatively simply, as is illustrated in FIG. 13. By way of example, the polarization measuring device 10 can be provided between the Fourier mirror 54 and the detector 56. As an alternative thereto, the polarization measuring device 10 can also be provided instead of the detector 56.

With such a mask metrology apparatus 48 comprising a polarization measuring device 10, it is possible to carry out a reliable measurement of the polarization of the light within the mask metrology apparatus 48 in a relatively simple manner.

In one possible configuration, the polarization measuring device 10 is displaceable in the directions perpendicular to the ray directions; this is indicated schematically in FIG. 13 by arrows only for the direction in the plane of the drawing. It is thus possible to detect the polarization of the light over the entire measurement region 56' even with a comparatively small polarization measuring device 10.

The measuring devices illustrated in FIGS. 12 and 13 can also can be used for the measurement of the imaging properties of an EUV illumination system of a lithography apparatus. In this case, a reticle is not used, rather the measuring device is instead positioned in the reticle plane. It is thus possible to carry out a reliable measurement of the polarization of the light generated by the EUV illumination system in a relatively simple manner.

It should be taken into consideration that the embodiments described above are merely by way of example and can be varied in diverse ways in the context of the scope of protection of the patent claims. In particular, the features of the embodiments described above can also be combined with one another.

By way of example, the detector 14 in the first exemplary embodiment need not necessarily be ring-shaped, but rather can also be realized with straight detector sections provided along the sides of a polygon (e.g. an octagon). Such a polygonal detector is easier to produce than a ring detector.

Furthermore, the reflector 12 does not necessarily have to be conical. For example, it is also possible that the reflector 12 is semi-spherical. Essentially the same effects as with a conical reflector 12 can also be attained with a bell-shaped or semi-spherical reflector. However, in that case, the area at which the light beam impinges substantially at the Brewster angle on the reflector is limited to a narrower range than in the case of a conical reflector.

Furthermore, in the exemplary embodiments explained above, the plane of incidence of the light rays in the light beam varies depending on the location on the reflector 12 at which the light rays impinge on the reflector. However, it is also possible for the plane of incidence of the light rays in the light beam to vary in a time-dependent manner. Such an embodiment of a polarization measuring device is illustrated schematically in FIG. 14.

Figure 14:
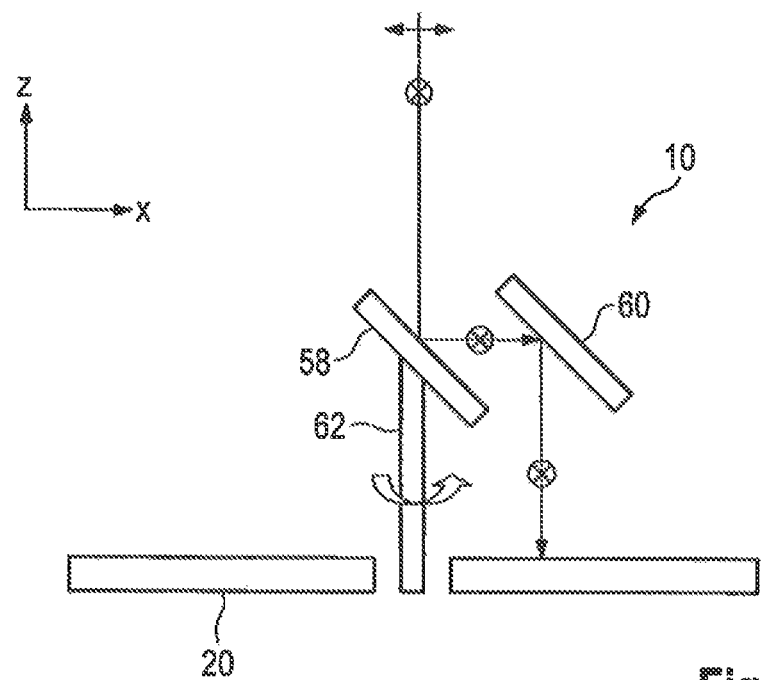
FIG. 14 shows a further exemplary embodiment of a polarization measuring device.

The polarization measuring device 10 in FIG. 14 may be a constituent element of a lithography apparatus or a mask metrology apparatus, for example. The polarization measuring device 10 comprises a first reflector 58, a second reflector 60 and a planar detector 20. In contrast to the reflector 12, the first reflector 58 is not conical, but rather planar, that is to say has a planar reflective surface. As also in the exemplary embodiments described above, the first reflector 58 is oriented such that the light beam incident on it impinges on it substantially at the Brewster angle. It should be taken into consideration that only the centroid ray of the incident light beam is illustrated in FIG. 14. The first reflector 58 is mounted in a rotating fashion on a mount 62 on a frame element or the like, not illustrated in more specific detail. The first reflector 58 can rotate about an optical axis of the light beam, for example about an axis that substantially corresponds to the centroid ray of the incident light beam.

In one possible configuration of this further exemplary embodiment, the second reflector 60 can likewise be embodied as a planar reflector which is fixedly connected to the first reflector 58 and rotates together with the latter about the axis defined by the mount 62. In an alternative configuration (not illustrated in more specific detail) of this exemplary embodiment, the second reflector 60 can be embodied like the reflector 18 in the exemplary embodiments described above, that is to say as a ring-shaped reflector arranged around the first reflector 58.

In this exemplary embodiment, too, the light beam impinges on the first reflector 58 substantially at the Brewster angle. Depending on the orientation of the first reflector 58, said orientation varying over time, the components in the light beam that are polarized perpendicularly to the plane of incidence are thus preferably reflected. In the case of the orientation illustrated in FIG. 14, these are the components polarized perpendicularly to the plane of the drawing. After a rotation of the first reflector by 90 degrees, these are the components polarized parallel to the plane of the drawing. The differently polarized components, as in the exemplary embodiments described above, are reflected a second time by the second reflector 60 and imaged onto different regions of the detector 20. Consequently, in this exemplary embodiment, too, the detector 20 can detect the differing polarization components and determine degree and/or direction of polarization of the incident light beam.

In comparison with the exemplary embodiments described above, what is disadvantageous in the exemplary embodiment shown in FIG. 14 is that it is necessary to provide a further actuator for the rotation of the first reflector 58. What is advantageous, however, is that the light beam always impinges on the reflector 58 at the same location. Measurement errors caused by location-dependent variations in the reflector can thus be avoided. Furthermore, the alignment is also obviated in this exemplary embodiment, since the reflector 58 is planar.

Figure 15:
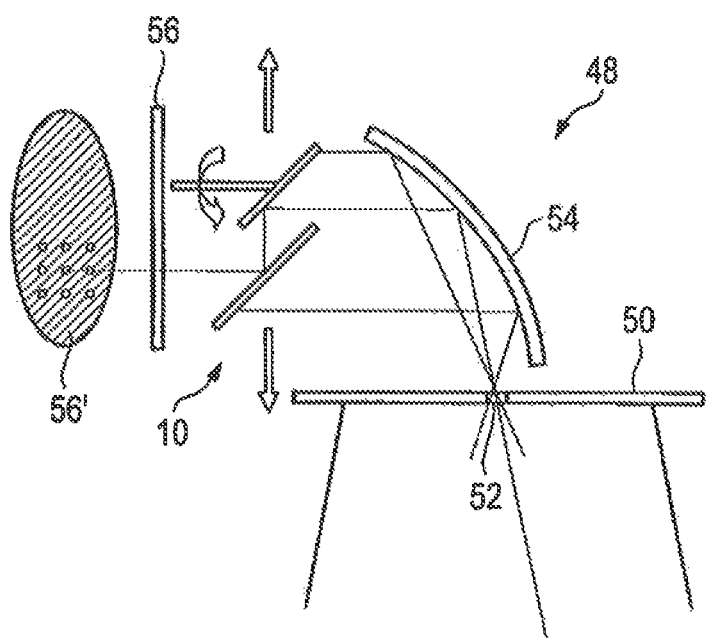
FIG. 15 shows an example of a mask metrology apparatus in which the polarization measuring device illustrated in FIG. 14 is integrated into the mask metrology apparatus illustrated in FIG. 12.

The polarization measuring device 10 illustrated in FIG. 14 can also be integrated into the mask metrology apparatus 48 illustrated in FIG. 12. Such a configuration is illustrated schematically in FIG. 15. The effects described above can be obtained by integrating such a polarization measuring device 10 into the mask metrology apparatus 48. Furthermore, in this case, too, as indicated by the arrows, the polarization measuring device 10 can be displaceable in the directions perpendicular to the ray directions.

LIST OF REFERENCE SIGNS

10 polarization measuring device
12 conical reflector
14 ring detector
16 light beam
18 ring-shaped reflector
20 planar detector
22 through-hole
24 mount
26 measurement region
28 centroid ray
30 illumination system
32 light source
34 field facet mirror arrangement
36 pupil facet mirror arrangement
38 mirror
40 mask
42 field facet mirror
44 pupil facet mirror arrangement
46 light beam
48 mask metrology apparatus
50 stop
52 pinhole
54 Fourier mirror
56 detector
58 first reflector
60 second reflector
62 mount

What is claimed is:

1. Polarization measuring device for determining polarization of a light beam, comprising:
   a reflector arrangement configured to reflect the light beam, wherein the reflector arrangement is configured such that a plane of incidence of light rays in the light beam varies in dependence on a location of the incidence, such that the reflector arrangement reflects differing polarization components of the light beam to different extents depending on the plane of incidence of the light rays, the reflector arrangement comprising a first reflector on which the light beam is incident, to produce light reflected by the first reflector, and a second reflector, which reflects the light reflected by the first reflector; and
   a detector configured to detect the differing polarization components;
   wherein the second reflector is arranged to reflect the light reflected by the first reflector before the light impinges on the detector, and
   wherein no transmissive elements are provided between a light source that generates the light beam and the detector.

2. Polarization measuring device according to claim 1, wherein the first reflector has a curved reflecting surface.

3. Polarization measuring device according to claim 1, wherein the first reflector is conical.

4. Polarization measuring device according to claim 3, further comprising:
   a mechanism configured to guide the light beam to circulate around the vertex of the conical reflector, and
   an evaluation unit configured to integrate the light intensity detected by the detector.

5. Polarization measuring method for determining the polarization of a light beam with a polarization measuring device as claimed in claim 3, comprising:
   guiding the light beam around the vertex of the first reflector.

6. Polarization measuring method according to claim 5, further comprising:
   guiding the light beam to circulate around the vertex of the first reflector, and
   integrating light intensity of the different polarization components detected by the detector.

7. Polarization measuring method according to claim 6, wherein the radius of the circulation through which the light beam is guided corresponds to at least half of a maximum diameter of the light beam.

8. Polarization measuring method according to claim 5, further comprising:
   carrying out a plurality of polarization measurements for different positions of incidence of the light beam on the first reflector, and
   averaging results of the plurality of the polarization measurements.

9. Method for polarization measurement according to claim 8,
   wherein the positions of incidence of the light beam on the first reflector correspond to vertices of a regular polygon.

10. Method for polarization measurement according to claim 5,
    wherein the polarization measuring device is provided in a lithography apparatus comprising:

a field facet mirror arrangement having a plurality of field facet mirrors; and a pupil facet mirror arrangement having a plurality of pupil facet mirrors, wherein at least one of the pupil facet mirrors is assigned respectively to each of the field facet mirrors; and wherein the polarization measuring device is provided on the pupil facet mirror arrangement, said method further comprising guiding the light beam around the vertex of the reflector by actuating one of the field facet mirrors.

11. Polarization measuring device according to claim 1, wherein the first reflector is semi-spherical.

12. Polarization measuring device according to claim 1, wherein the first reflector is pyramidal.

13. Polarization measuring device according to claim 1, wherein the first reflector is stationary during operation of the polarization measuring device.

14. Polarization measuring device according to claim 1, wherein the detector is ring-shaped and arranged around the first reflector.

15. Polarization measuring device according to claim 1, wherein the reflector arrangement is arranged such that during operation of the polarization measuring device the light beam impinges on the first reflector substantially at the Brewster angle.

16. Polarization measuring device according to claim 1, wherein the second reflector is ring-shaped and is arranged around the first reflector.

17. Polarization measuring device according to claim 1, wherein the detector is a planar detector that is arranged in a plane which intersects the light rays reflected by the second reflector.

18. Polarization measuring device according to claim 1, further comprising:
 an arrangement configured to carry out a plurality of individual polarization measurements for different positions of incidence of the light beam on the first reflector, and
 an evaluation unit configured to average results of the plurality of individual polarization measurements.

19. Polarization measuring device according to claim 1, configured to determine the polarization of extreme ultraviolet (EUV) radiation.

20. Polarization measuring device according to claim 1, configured to determine a degree of polarization and/or a direction of polarization of the light beam.

21. Polarization measuring device according to claim 1, wherein the first reflector is configured such that the plane of incidence of the light rays in the light beam varies over time.

22. Polarization measuring device according to claim 21, wherein the first reflector is configured to rotate about the optical axis of the light beam.

23. Lithography apparatus comprising a polarization measuring device configured to determine the polarization of a light beam, the polarization measuring device comprising:
 a reflector configured to reflect the light beam, wherein the reflector is configured such that the plane of incidence of the light rays in the light beam varies in at least one of a location-dependent or a time-dependent manner, such that the reflector reflects differing polarization components of the light beam to different extents dependent on the plane of incidence;
 a detector for detecting the differing polarization components, a field facet mirror arrangement having a plurality of field facet mirrors; and a pupil facet mirror arrangement having a plurality of pupil facet mirrors, wherein at least one of the pupil facet mirrors is assigned respectively to each of the field facet mirrors;

wherein the polarization measuring device is provided on the pupil facet mirror arrangement.

24. Lithography apparatus according to claim 23, wherein the field facet mirrors are configured to tilt such that the position of the light beam on the polarization measuring device is adjusted by tilting the field facet mirrors.

25. Lithography apparatus according to claim 23, further comprising a plurality of further polarization measuring devices provided on the pupil facet mirror arrangement, wherein each of the further polarization measuring devices comprises:
 a reflector configured to reflect the light beam, wherein the reflector is configured such that a plane of incidence of light rays in the light beam varies in dependence on a location of the incidence, such that the reflector reflects differing polarization components of the light beam to different extents depending on the plane of incidence of the light rays; and
 a detector configured to detect the differing polarization components.

26. Measuring arrangement for measuring imaging properties of an imaging system, wherein the measuring arrangement comprises:
 a stop having a pinhole configured to pass the light shaped by the imaging system,
 a mirror configured to reflect the light passing through the pinhole, and
 a detector configured to detect the light reflected by the mirror, and
 a polarization measuring device comprising:
  a reflector configured to reflect the light, wherein the reflector is configured such that a plane of incidence of light rays in the light varies in dependence on a location of the incidence, such that the reflector reflects differing polarization components of the light to different extents depending on the plane of incidence of the light rays; and
  a detector configured to detect the differing polarization components;
 wherein the polarization measuring device is arranged between the mirror and the detector.

27. Measuring arrangement according to claim 26, wherein the imaging system is a mask metrology apparatus.

28. Measuring arrangement according to claim 26, wherein the imaging system is an illumination system of a lithography apparatus.

29. Polarization measuring device for determining polarization of a light beam, comprising:
 a reflector configured to reflect the light beam, wherein the reflector is configured such that a plane of incidence of light rays in the light beam varies in dependence on a location of the incidence, such that the reflector reflects differing polarization components of the light beam to different extents depending on the plane of incidence of the light rays; and
 a detector configured to detect the differing polarization components;
 wherein the reflector is configured such that the plane of incidence of the light rays in the light beam varies over time.

30. Polarization measuring device for determining polarization of a light beam, comprising:
a reflector configured to reflect the light beam, wherein the reflector is configured such that a plane of incidence of light rays in the light beam varies in dependence on a location of the incidence, such that the reflector reflects differing polarization components of the light beam to different extents depending on the plane of incidence of the light rays; and a detector configured to detect the differing polarization components: wherein the reflector is conical,
the polarization measuring device is configured to circulate the light beam around the vertex of the reflector, and the polarization measuring device is configured to integrate light intensity of the different polarization components detected by the detector.

* * * * *